United States Patent [19]

Fisher et al.

[11] Patent Number: 5,114,087
[45] Date of Patent: May 19, 1992

[54] FIBER COMBINER FOR ALIGNING FILAMENTS IN A PLANAR FILAMENT ARRAY

[75] Inventors: Michael V. Fisher, San Diego; Kurt M. Schaubel, Cardiff; William A. Raggio, Del Mar, all of Calif.

[73] Assignee: General Atomics, San Diego, Calif.

[21] Appl. No.: 586,270

[22] Filed: Sep. 21, 1990

[51] Int. Cl.[5] ............... B65H 54/00; B65H 59/00; B65H 77/00; H01B 12/00
[52] U.S. Cl. ............... 242/42; 242/45; 28/194; 156/179; 505/1
[58] Field of Search .......... 28/102, 167, 169, 190–199; 156/178, 179, 176; 242/355 R, 42, 45, 156; 505/1

[56] References Cited

U.S. PATENT DOCUMENTS

| | | | |
|---|---|---|---|
| 2,542,097 | 1/1951 | Shaffer et al. | 28/194 |
| 2,615,655 | 10/1952 | Guild | 28/194 X |
| 3,523,844 | 8/1970 | Crimmins et al. | 156/179 X |
| 4,112,660 | 9/1978 | Ferrentino et al. | 242/156 |
| 4,289,558 | 9/1981 | Eichenbaum et al. | 156/179 |
| 4,364,788 | 12/1982 | Bloodworth, Jr. et al. | 156/179 |
| 4,623,101 | 11/1986 | Cacak | 242/45 |
| 4,762,583 | 8/1988 | Kaempen | 156/178 |
| 4,974,301 | 12/1990 | Beerli et al. | 28/191 |

Primary Examiner—Daniel P. Stodola
Assistant Examiner—Michael R. Mansen
Attorney, Agent, or Firm—Nydegger & Associates

[57] ABSTRACT

A device for aligning superconductor filaments to form a filament layer includes a backboard and a number of motor-driven supply spools. Each of the supply spools is rotatably mounted on the backboard, and each of the supply spools holds one end of an individual superconductor filament. The opposite ends of the filaments are attached to a single rotatable wire take-up spool. Accordingly, the wire take-up spool can be rotated to transfer the filaments from the respective supply spools to the take-up spool. A combiner board is mounted on the backboard normal to the backboard between the supply spools and the wire take-up spool. The combiner board receives each of the superconductor filaments as the filaments are transferred from the respective supply spools to the take-up spool to guide the filaments into a layer of aligned superconductor filaments. Additionally, each supply spool has a tension controller individually associated with the respective supply spool. Each of the tension controllers engages the superconductor filament that is associated with the respective supply spool and establishes a speed of rotation for the associated supply spool motor such that it matches the speed of the take-up spool. In addition, the predetermined angle of pivot arm component of the tension controller establishes a predetermined tension of the respective filament.

13 Claims, 3 Drawing Sheets

FIBER COMBINER FOR ALIGNING FILAMENTS IN A PLANAR FILAMENT ARRAY

FIELD OF THE INVENTION

The present invention pertains generally to superconductor wires. More specifically, the present invention pertains to apparatus for aligning several superconductor filaments in a layer of superconductor material. The present invention is particularly, but not exclusively, useful in the manufacturing of a bendable cable which is made of high temperature superconductor ceramic materials.

BACKGROUND OF THE INVENTION

With the advent of superconductor materials which have superconducting transition temperatures ($T_c$) above about 20 Kelvin, there has arisen the possibility of highly efficient transmission of electrical power, i.e., transmission of electrical power with substantially no transmission losses. This potential, however, is very much dependent on the ability to provide a structure which will support and protect relatively long transmission cables which are typically made of a bundle of individually manufactured high-$T_c$ superconductor filaments.

Unfortunately, presently known high-$T_c$ superconductor materials are ceramics which are relatively brittle and fragile. Furthermore they are particularly susceptible to breakage when subjected to tensile stresses, as compared to compressive stresses. Consequently, the structural limitations of ceramic superconductor materials are most apparent when any bending (and, hence, potential tensioning) of the superconductor may be necessary, as is commonly required in a wide variety of potential applications.

To avoid imposing undue tensile stress on the ceramic filaments of a superconductor cable when the cable is bent, it is desirable to support the cable in a structure which has a larger cross-sectional area than the cable. More specifically, it is well-known that when a structure is bent, portions of the structure will be in tension and other portions of the structure will be in compression. Accordingly, when a structure which has a larger cross-sectional area than the ceramic superconductor cable is used to support the cable, the superconductor cable can effectively be positioned in that portion of the bendable support structure which will be subjected only to compressive stresses. As stated above, modern ceramic superconductors can withstand compression more readily than they can withstand tension. Accordingly, it is necessary to form the cable into a relatively flat layer of coparallel superconductor filaments, so that the cable will fit into the desired portion of the supporting structure. Furthermore, in the case of relatively long lengths of cable, it is desirable that the individual superconductor filaments which make up the cable be automatically aligned and positioned in the supporting structure.

In light of the above, it is an object of the present invention to provide an apparatus for manufacturing a cable from ceramic superconductor filaments in which the filaments are aligned into a coparallel, juxtaposed relationship with other filaments in the cable. It is another object of the present invention to provide an apparatus for manufacturing a cable from ceramic superconductor filaments which automatically aligns the superconductor filaments in a layer of superconductor material. Still another object of the present invention is to provide an apparatus for manufacturing a cable from ceramic superconductor filaments which is relatively easy to use and comparatively cost effective.

SUMMARY

A device for aligning several (e.g., six or twelve) superconductor filaments in juxtaposition to form a layer of superconductor material includes a backboard and a number of motor-driven supply spools. Each of the supply spools is rotatably mounted on the backboard, and each of the supply spools holds one end of an individual superconductor filament. The respective opposite ends of the filaments (i.e., the ends of the filaments which are not held on an associated supply spool) are collectively attached to a single rotatable wire take-up spool. Accordingly, the wire take-up spool can be rotated to transfer the filaments from the respective supply spools to the take-up spool.

The device of the present invention also includes a combiner board. The combiner board is mounted on the backboard normal to the backboard. Additionally the combiner board is situated between the supply spools and the wire take-up spool. One surface of the combiner board is formed with a guide channel which is tapered inwardly toward the supply spools, i.e., the channel is incrementally enlarged away from the supply spools to the take-up spool. A series of curved, elongated grooves is also formed on the combiner board, and each groove extends from the guide channel toward the backboard. More particularly, the grooves of the combiner board are sequentially aligned on the surface of the combiner board for individually receiving one of the superconductor filaments and feeding the respective superconductor filament into the guide channel. Stated differently, the combiner board individually receives each of the superconductor filaments as the filaments are transferred from the respective supply spools to the take-up spool. As the combiner board receives the filaments, the combiner board guides the filaments into alignment, i.e., the combiner board guides the filaments into a planar array wherein the filaments are coparallel.

Additionally, each supply spool has a tension controller individually associated with the respective supply spool. In accordance with the present invention, each of the tension controllers engages the superconductor filament that is associated with the respective supply spool and establishes a predetermined tension in the filament as the filament is being transferred from the filament's associated supply spool to the take-up spool.

More particularly, each tension controller includes a pivot arm that is configured as a pendulum and has a pivot end rotatably attached to the backboard. Each pivot arm also has a free end that is fixedly attached to a hollow curved guide. The respective filament from the associated supply spool is positioned through the lumen of the curved guide of the respective pivot arm and can consequently cause the arm to pivot when the take-up spool moves faster or slower than the feed spool. Mounted on the backboard adjacent each pivot arm is a respective optical position sensor which senses the position of the respective pivot arm when the associated filament is under tension. Each respective position sensor generates a signal in response to the position of the associated pivot arm. Also, a potentiometer is individually coupled to the pivot end of each pivot arm to sense the direction of pivotal motion of the arm and generate a signal in response. The signals from the respective potentiometers and optical sensors are sent to a respective signal processor, which is electrically coupled to the motor of the respective associated supply spool. Each signal processor controls the speed of rotation of its associated supply spool based on the signals from the associated optical sensor and potentiometer. The respective signal processors thus match the speed of the feed spool with the speed of the take-up spool and holds the pendulum at a desired angle, of which this predetermined angle controls the tension on the filaments.

Additionally, each tension controller also includes a second position sensor for sensing the position of the associated pivot arm when the wire is substantially slack or broken. Each of the second position sensors accordingly generates a signal which is sent to the respective signal processor which is electrically coupled to the respective supply spool motor to stop the respective supply spool motor when the respective filament becomes slack or breaks. Also, the signal from each second position sensor can be coupled to an alarm for providing audio or visual indication of when a respective filament becomes slack.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
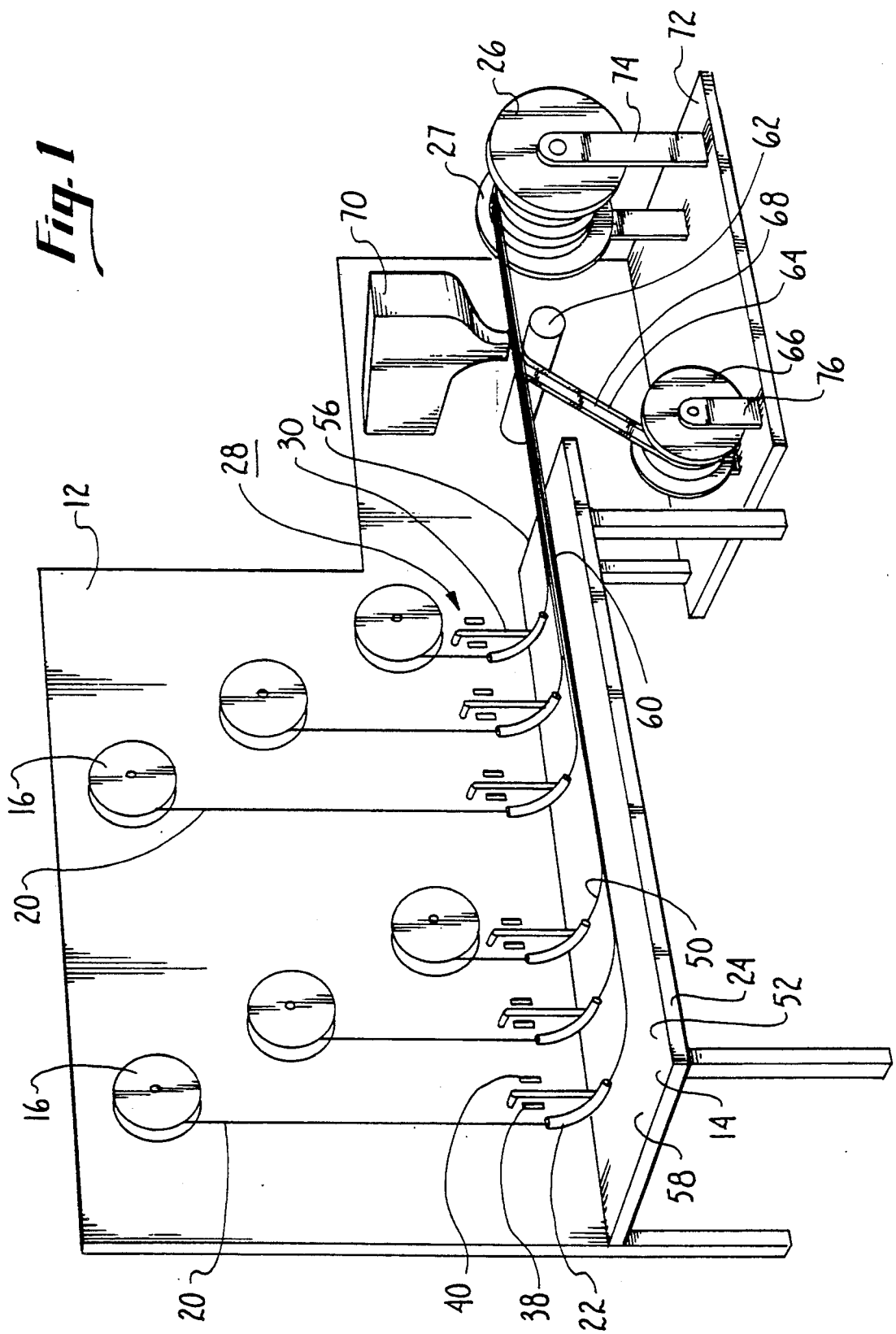
FIG. 1 is a perspective view of the novel device for aligning superconductor wires of the present invention.

Referring initially to FIG. 1, a device for aligning superconductor wires is shown, generally designated 10. Device 10 includes a backboard 12 and a combiner board 14. As shown, combiner board 14 is attached to or mounted on backboard 12 substantially orthogonally to backboard 12. A plurality of supply spools 16 are also shown mounted on backboard 12. It is to be understood that supply spools 16 are rotatably mounted on backboard 12, and that each spool 16 can be rotated by a respective motor (one supply spool motor 18 shown schematically in FIG. 5). It is to be further understood that while FIG. 1 shows six (6) supply spools 16, device 10 can include a greater or lesser number of supply spools 16. For example, any number of supply spools 16 can be mounted on backboard 12, if desired.

As shown in FIG. 1, each supply spool 16 is attached to a respective superconductor filament 20. Each superconductor filament 20 can be made of any suitable superconductor material which has a superconducting transition temperature above about twenty (20) Kelvin. In the preferred embodiment, each superconductor filament 20 is made of a superconductor material which has the chemical formula $REBa_2Cu_3O_{7-x}$, where RE is selected from the group consisting of yttrium and elements having an atomic number between fifty seven (57) and seventy one (71), inclusive, and x is from zero (0) to one half (0.5), inclusive. If desired, each filament 20 can have a nickel-based support substrate and a silver-based protective overcoating. Such a superconductor filament 20 is fully disclosed in co-pending U.S. patent application entitled "Process and Apparatus for Fabrication of Silver-Coated High Temperature Ceramic Superconductor Wire", assigned to the same assignee as the present invention.

Still referring to FIG. 1, each superconductor filament 20 is shown extending through a respective curved hollow guide tube 22. Each guide tube 22 is curved outwardly from backboard 12, i.e., each guide tube 22 is curved from backboard 12 toward edge 24 of combiner board 14. Also, each guide tube 22 is curved from backboard 12 toward a rotatable motor-driven take-up spool 26, which is attached to each of the filaments 20. Take-up spool 26 is operatively associated with a drive motor 27. The respective filaments 20 are received through the respective lumens of the guide tubes 22. The respective lumens of the guide tubes 22 can be coated with Teflon ®.

Additionally, as shown in FIG. 1, the guide tubes 22 are fixedly attached to respective tension controllers, generally designated 28. More particularly, referring briefly to FIG. 5, one tension controller 28 is shown to include a pivot arm 30 which is rotationally attached to backboard 12 at a pivot end 32. Pivot arm 30 is a pendulum which is fixedly attached to guide tube 22, so that as guide tube 22 moves in response to differences in speed between the take-up and feed spool, pivot arm 30 also moves. Stated differently, the tension of filament 20 depends on the angular position (relative to the free-hanging position) of pivot arm 30. Pivot end 32 of pivot arm 30 is mechanically coupled to the center tap 34 of a potentiometer 36 (shown schematically in FIG. 6). Thus, as pivot arm 30 pivots, the resistive setting of center tap 34 is thereby adjusted. Potentiometer 36 is electrically connected to a signal processor 42 via line 41.

Figure 5:
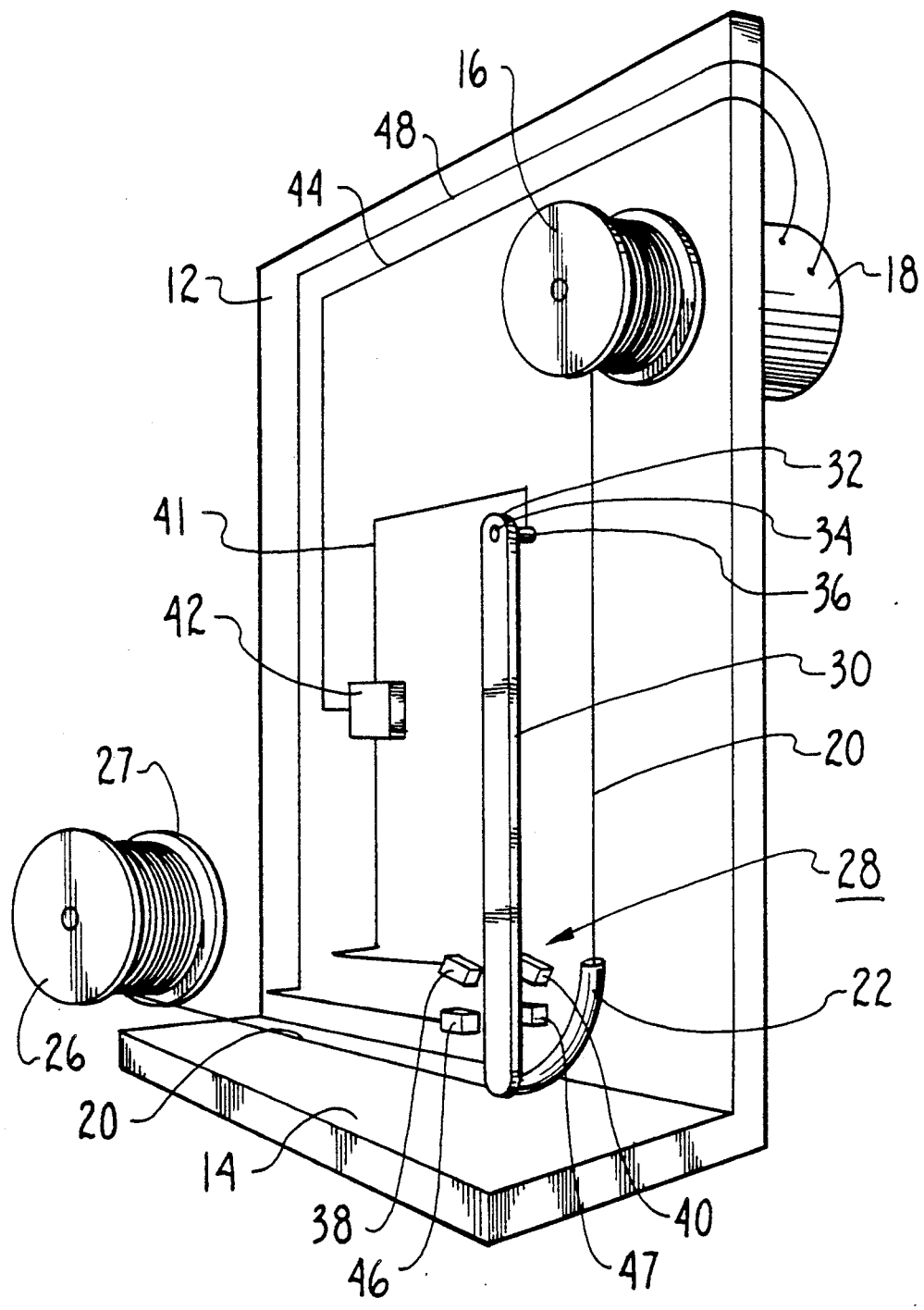
FIG. 5 is a schematic diagram of one tension controller of the novel device for aligning superconductor wires of the present invention with portions shown in phantom for clarity.

Moreover, a light sensor 38 is mounted on backboard 12 adjacent pivot arm 30 to detect when pivot arm 30 is blocking the light path between sensor 38 and a light source 40. The location of light sensor 38 and source 40 ultimately determines the angle of the pivot arm and thus the tension of the filament 20. More specifically, light sensor 38 is positioned on backboard 12 such that the light path between sensor 38 and source 40 is blocked when the take-up spool is rotating faster than the feed spool and it is not blocked when the take-up spool is rotating slower than the feed spool. It is to be appreciated, however, that sensor 38 and source 40 together can be any suitable non-contact position sensing device, such as optical electronic, or magnetic sensor. As shown in FIG. 5, light sensor 38 is electrically connected to signal processor 42. Signal processor 42 is in turn electrically connected via line 44 to supply spool motor 18. It is to be understood that motor 18 is operationally engaged with supply spool 16 to rotate spool 16 at a selectively established speed of rotation.

Furthermore, FIG. 5 shows that a second light sensor 46 can be positioned on backboard 12 to sense when wire 20 is substantially slack. More specifically, sensor 46 is positioned on backboard 12 such that the light path between light source 47 and sensor 46 is interrupted when pivot arm 30 hangs substantially vertically (downward in FIG. 5), i.e. pivot arm 30 interrupts the light path between sensor 46 and source 40 when there is substantially no tension on filament 20. As shown in FIG. 5, sensor 46 is electrically connected to signal processor 42 which in turn is electrically connected to motor 18 via line 48. The tension controller 28 described above is fully disclosed in co-pending U.S. patent application entitled "Tension Control System for Fiber Take-Up System", assigned to the same assignee as the present invention.

Figure 2:
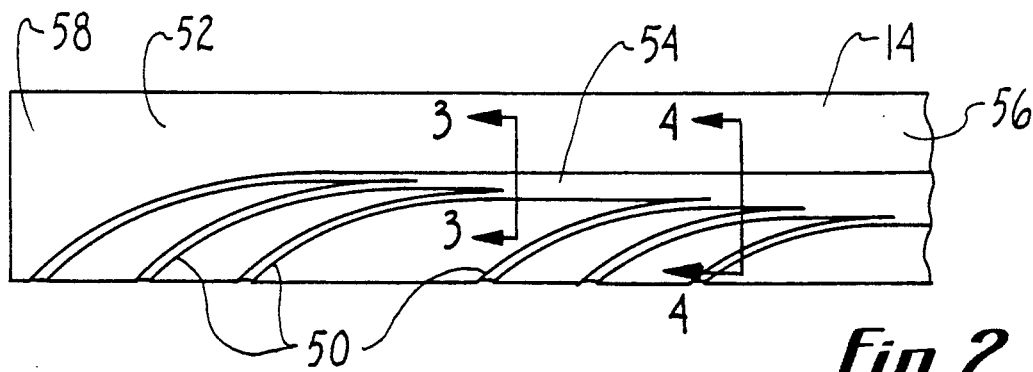
FIG. 2 is a top view of the combiner board of the novel device for aligning superconductor wires of the present invention.

In cross-reference to FIGS. 1 and 2, it can be appreciated that guide tubes 22 guide the respective filaments 20 into respective elongated curved grooves 50, which are formed on surface 52 of combiner board 14. More particularly, curved grooves 50 receive their respective filaments 20 and are gently curved to feed the respective filaments 20 into alignment in guide channel 54. It will be understood that radius of curvature of the grooves 50 is relatively large, in order to avoid undue bending stresses on the potentially brittle filaments 20.

Figure 3:
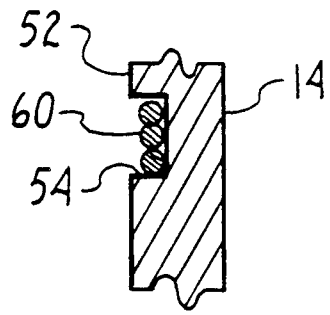
FIG. 3 is a cross-sectional view of the combiner board of the novel device for aligning superconductor wires of the present invention, as seen along the line 3—3 in FIG. 2 with portions broken away for clarity.
Figure 4:
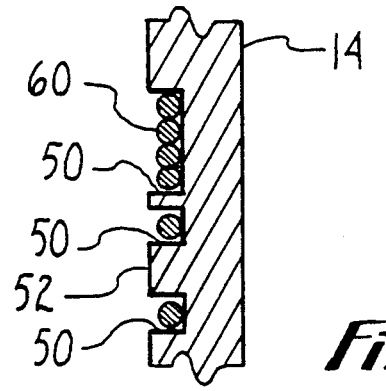
FIG. 4 is a cross-sectional view of the combiner board of the novel device for aligning superconductor wires of the present invention, as seen along the line 4—4 in FIG. 2 with portions broken away for clarity.

As shown best in FIG. 2, guide channel 54 is incrementally enlarged, i.e., widened, to accommodate each of the filaments 20 as the filaments 20 are individually fed into channel 54. Stated differently, channel 54 is tapered inwardly from end 56 of combiner board 14 to end 58 of combiner board 14. As shown in cross-reference to FIGS. 2, 3, and 4, channel 54 guides the filaments 20 into co-parallel alignment. In other words, channel 54 guides the filaments 20 into a layer 60. It is to be understood in reference to FIGS. 3 and 4 that filament layer 60 is a coplanar array of filaments 20.

Referring back to FIG. 1, filament layer 60 is shown being drawn over a roller 62 by take-up spool 26. Also, a trough-like support substrate 64 is drawn by take-up spool 26 over roller 62 from a support substrate supply spool 66. As shown in FIG. 1, layer 60 is guided into the trough 68 formed by support substrate 64. FIG. 1 also shows that a dispenser 70 can be positioned over support substrate 64 and layer 60 to direct a solder paste (not shown) onto layer 60. The paste is subsequently melted and the layer 60 is soldered into trough 68 of support substrate 64 forming one monolithic structure. Finally, take-up spool 26 and substrate supply spool 66 can be mounted on a base 72 by respective supports 74, 76. The details of dispenser 70 and support substrate 64 are fully disclosed in a co-pending U.S. patent application entitled "Process for Soldering Superconducting Cables into a Copper Channel", which is assigned to the same assignee as the present invention.

OPERATION

In the operation of device 10, reference is made to FIGS. 1 and 2. It is to be understood that in the operation of device 10, the filaments 20 are continuously drawn from the respective supply spools 16. Accordingly, successive portions of the filaments 20 are aligned by combiner board 14 and then soldered in support substrate 64.

More specifically, take-up spool 26 is rotated at a predetermined speed by motor 27 to draw the individual filaments 20 through their respective guide tubes 22 onto combiner board 14. As the filaments 20 are drawn onto combiner board 14, the respective curved guides 50 guide the filaments 20 into alignment to form the filament layer 60 in channel 54. Portions of layer 60 which pass over roller 62 are positioned into respective portions of the trough 68 of support substrate 64. Additionally, solder is paste deposited onto portions of layer 60 and support substrate 64 which are drawn beneath dispenser 70. This is followed by a subsequent melting process that solders layer 60 onto support substrate 64.

Importantly, as the fibers 20 are drawn from their respective supply spools 16 by take-up spool 26, a predetermined tension of each filament 20 is established by the respective tension controller 28. More particularly, each individual tension controller 28 controls its associated supply spool motor 18 to establish a speed of rotation of the respective supply spool 18 and thereby match the speeds of the take-up and feed spools. The predetermined tension on the respective filament 20 is established by the angle of the pendulum (pivot arm) which is decided by the location of light sensor 38 and source 40.

Figure 6:
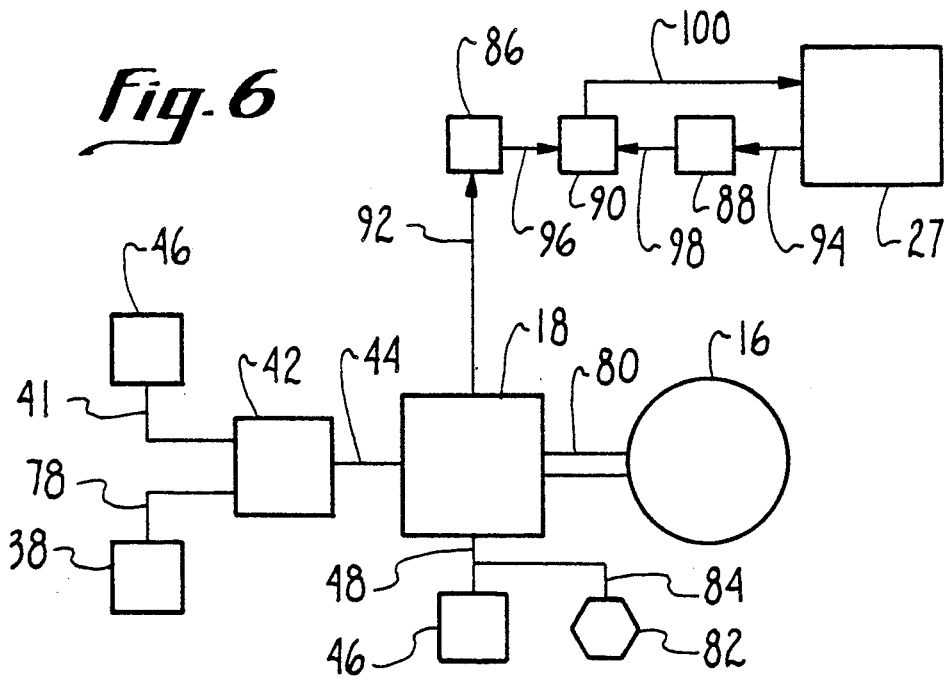
FIG. 6 is a schematic diagram of the electrical components of one tension controller of the novel device for aligning superconductor wires of the present invention.

Referring now to FIG. 6, the circuitry of a single tension controller 28 is seen to include a light sensor 38, which, as disclosed above, provides a signal which indicates whether the associated pivot arm 30 is blocking the light path between sensor 38 and light source 40. This signal is electrically conducted to signal processor 42 via line 78. Also, recall that the signal from potentiometer 36 is indicative of the direction of pivotal motion of pivot arm 30. The signal from potentiometer 36 is electrically conducted to signal processor 42 via line 41. The signals from potentiometer 36 and light sensor 38 are processed by signal processor 42, which develops a control signal in response. This control signal is sent to motor 18 via line 44 to control the speed of motor 18 and, hence, the speed of rotation of supply spool 16, which is mechanically coupled to motor 18 through coupling 80. Accordingly, the speed of the feed and take-up spools are matched and the pendulum is held at the predetermined angle, dictated by the location of light sensor 38. Accordingly, a predetermined tension on filament 20 is established.

FIG. 6 further shows that the signal from light sensor 46 is sent to signal processor 42 via electrical line 48. As disclosed above, the signal from sensor 46 indicates whether pivot arm 30 blocks the light path between sensor 46 and source 47. Recall that pivot arm 30 blocks the light path between sensor 46 and source 47 when there is substantially no tension on filament 20. It is to be understood that the signal from sensor 46 is sent to signal processor 42, which in turn causes motor 18 to stop rotating spool 16 when filament 20 becomes slack (e.g., because take-up spool 26 has stopped) or breaks. As disclosed above, take-up spool 26 will stop when another filament 20 (not shown in FIG. 6) has broken and microprocessor 90 has accordingly caused motor 27 to stop rotating. Consequently, in the event that take-up spool 26 stops while supply spool 16 continues to rotate, overfeeding of filament 20 through device 10 can be avoided by stopping spool 16 when filament 20 becomes substantially slack. Such overfeeding could cause relatively brittle filament 20 to undesirably kink, bend, or break. If desired, an alarm 82 can be connected via line 84 to sensor 46 to provide an audio or visual indication of potential overfeeding of filament 20.

FIG. 6 also shows that an encoder 86 can be connected to motor 18 and an encoder 88 connected to motor 27. Encoders 86, 88 are suitable devices well-known in the art which sense the speed of rotation of respective motors 18, 27. It is to be understood that each motor 18 shown in FIG. 1 has an encoder (not shown) associated with the respective motor 18 to sense the speed of rotation of the respective motor 18. Each of the encoders 86, 88 is electrically connected to a microprocessor 90 via respective lines 96, 98. Microprocessor 90 compares the signal from each of the encoders 86 to the signal from encoder 88. As the skilled artisan will appreciate, the speed of the motors 18 will be proportional to the speed of the motor 27 under normal operating conditions, i.e. when all filaments 20 are being successfully drawn from the respective supply spools 16 to take-up spool 26. On the other hand, when a filament 20 breaks, the speed of the associated motor 18 will not be proportional to the speed of motor 27. Accordingly, when the comparison of the signals from any encoder 86 to the signal from encoder 88 indicates that the filament 20 associated with the respective encoder 86 has broken, microprocessor 90 sends a signal via line 100 to interrupt electrical power to motor 27.

While a particular fiber combiner as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. A device for aligning a plurality of superconductor filaments in juxtaposition to form a layer of superconductor material which comprises:
   a backboard;
   a plurality of supply spools rotatably mounted on said backboard, each of said supply spools holding a separate superconductor filament;
   a take-up spool for receiving said plurality of filaments;
   a plurality of tension controllers, each of said tension controllers being mounted on said backboard and including a curved guide tube to individually receive one of said superconductor filaments from said respectively associated supply spool to generate a signal representative of the difference in speed of said take-up spool and said supply spool;
   a combiner board mounted on said backboard and having a plurality of elongated grooves thereon each of said grooves sequentially aligned on said combiner board for individually receiving and feeding said superconductor filaments from said respectively associated guide tube of said tension controller into a guide channel to guide said superconductor filaments into said layer of superconductor material;
   a means for receiving said layer of superconductor material from said combiner board; and
   a plurality of drive means each electrically connected with a respective said tension controller and operatively connected with a respective said supply spool for rotating said respective supply spool in response to said signal.

2. A device as recited in claim 1 wherein said tension controller comprises:
   a pivot arm pivotally mounted on said backboard;
   a curved guide tube for receiving said superconductor filament therealong, curved outwardly from the backboard and curved towards said take-up spool, and said guide tube being attached to said pivot arm for pivoting motion therewith; and
   a position sensor mounted on said backboard for sensing the position of said pivot arm to generate said signal.

3. A device as recited in claim 2 wherein said position sensor comprises a first non-contacting optical sensor including a sensor and a source mounted in a first light path for detecting a position of said pivot arm by the pivot arm blocking or not blocking the first light path, and a second non-contacting optical sensor including a sensor and a source mounted in a second light path for detecting when said filament is slack or broken by the pivot arm blocking or not blocking the second light path.

4. A device as recited in claim 3 further comprises a potentiometer coupled to said pivot arm for determining the direction of pivotal motion of said arm and generating a second signal in response thereto to rotate said supply spool in response to said second signal.

5. A device as recited in claim 3 further comprising alarm means electrically connected with said position sensor to indicate when said superconductor filament is slack or broken.

6. A device as recited in claim 5 wherein said backboard has a surface and said surface of said backboard is substantially perpendicular to said surface of said combiner board.

7. A device as recited in claim 6 wherein said backboard is mounted substantially perpendicular to said combiner board.

8. A device for aligning a plurality of fragile, brittle filaments in juxtaposition in a planar filament array, which comprises:
   a backboard;
   a plurality of supply spools rotatably mounted on said backboard, each of said supply spools for individually holding one of said filaments, each of said supply spools being operatively associated with a respective motor for rotating said respective supply spool;
   a rotatable take up spool connectable to each of said filaments for transferring said filaments from said respective supply spools to said take up spool when said take up spool is rotated;
   a plurality of tensioning means mounted on said backboard, each of said tensioning means including a curved guide tube for receiving and guiding one of said filaments and with each curved guide tube attached to a pivot arm for applying a desired tension on said respective filaments and a position sensor for sensing the position of said pivot arm for sensing the difference in speeds of said respective supply spool and take-up spool and generating a signal in response thereto;
   means electrically associated with each of said motors for controlling the speed of said respective motor in response to said signal from said respective tensioning means; and
   guide means including a plurality of elongated grooves formed and substantially aligned on a combiner board attached to said backboard for individually receiving said filaments from respective said guide tubes and a guide channel aligned with said elongated grooves for guiding said filaments into a coplanar array, said filaments in said array being substantially coparallel.

9. A device as recited in claim 8 wherein said position sensor comprises a first non-contacting optical sensor for detecting the angle of said pivot arm, and a second non-contacting optical sensor for detecting when said filament is slack or broken.

10. A device as recited in claim 9 further comprising a potentiometer coupled to said pivot arm for determining the direction of pivotal motion of said arm and generating a second signal in response thereto to rotate said supply spool motor in response to said second signal.

11. A device as recited in claim 10 further comprising alarm means electrically connected with said position sensor to indicate when said filament is slack or broken.

12. A device as recited in claim 8 wherein said guide channel is incrementally enlarged to accept and accommodate said filaments in a juxtaposed relationship as each of said superconductor filaments is fed into said guide channel.

13. A device as recited in claim 12 wherein said backboard has a surface and said surface of said backboard is substantially perpendicular to said surface of said combiner board.

* * * * *